US006580276B2

(12) United States Patent
Hilal

(10) Patent No.: US 6,580,276 B2
(45) Date of Patent: Jun. 17, 2003

(54) TAP SWITCH FOR FREQUENCY RESPONSE AND PARTIAL DISCHARGE MEASUREMENT

(75) Inventor: Nagi Hilal, Raleigh, NC (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 09/939,344

(22) Filed: Aug. 24, 2001

(65) Prior Publication Data

US 2003/0038016 A1 Feb. 27, 2003

(51) Int. Cl.$^7$ ............................................. G01R 31/06
(52) U.S. Cl. ..................................................... 324/547
(58) Field of Search ........................ 324/547, 415–424, 324/754–758; 307/112, 125; 361/35, 38, 63, 65, 78

(56) References Cited

U.S. PATENT DOCUMENTS

| | | | | |
|---|---|---|---|---|
| 4,408,607 A | * | 10/1983 | Maurer | 607/61 |
| 4,857,856 A | * | 8/1989 | Coleman et al. | 324/547 |
| 4,935,839 A | * | 6/1990 | Lockwood | 324/419 |
| 5,172,067 A | * | 12/1992 | Hoffmann | 324/713 |
| 6,313,640 B1 | * | 11/2001 | Nasrallah et al. | 324/536 |
| 2002/0011848 A1 | * | 1/2002 | Coffeen | 324/547 |
| 2002/0109507 A1 | | 8/2002 | Khalin et al. | 342/547 |

* cited by examiner

Primary Examiner—Christine Oda
Assistant Examiner—Timothy J. Dole
(74) Attorney, Agent, or Firm—Woodcock Washburn LLP

(57) ABSTRACT

A system and method for conducting diagnostic services on live electrical equipment, such as electrical power transformers using a tap switch installed into each phase of the transformer. The tap switch is used along with the appropriate test and measurement equipment connected to a test and measurement system to perform the diagnostic service when the transformer is live and in-service. The tap switch allows the diagnostic service to be performed without the hazard of disconnecting the bushing tap in order to connect the bushing tap back to the test and measurement equipment. The tap switch provides for live diagnostic tests and measurements for the early identification of potential failures using diagnostic services, such as partial discharge (PD) and frequency response. Thus, live diagnostics can be performed on electrical power transformers while the transformers are in-service using a tap switch resulting in a reduction in down time and thus costs.

11 Claims, 6 Drawing Sheets

TAP SWITCH FOR FREQUENCY RESPONSE AND PARTIAL DISCHARGE MEASUREMENT

FIELD OF THE INVENTION

The present invention relates in general to electrical power systems, and particularly, to diagnostic services for electrical power transformers.

BACKGROUND OF THE INVENTION

In the deregulated power industry there will be more demand for diagnostic services of electrical equipment, such as electrical power transformers. Many of these diagnostic services currently require that the electrical equipment (e.g., the transformer) be shut off and be out of service and this is costly to the power company. Exemplary diagnostic services that can be used to identify early warning of potential failures of power transformers are partial discharge (PD) and frequency response. However, conventional techniques for performing diagnostic services typically require that the electrical power equipment be shutdown and taken off-line in order to perform the required diagnostic services.

Electrical pre-breakdowns within electrical power equipment can lead to proliferation of chemical and mechanical destruction of insulation parts and, if not corrected, these electrical pre-breakdowns can eventually lead to equipment failure. Although numerous preventive measures are taken to decrease the probability of these internal events, electrical pre-breakdowns are still present in electrical power equipment.

For example, partial discharge (PD) is an initial component of electrical pre-breakdown and is typically accompanied by acoustic events. This phenomenon serves as a basis for several conventional acoustical techniques of detecting and locating electrical discharges. However, these conventional techniques for determining the location of electrical discharge events typically require that the electrical power equipment, such as a power transformer, be shut-down and taken out of service in order to perform the required diagnostic test and/or measurement.

As can be appreciated, conventional diagnostic services for detecting the probability of internal events leading to the breakdown of electrical power equipment are very intrusive and are expensive due to the fact that the electrical equipment is shut-down and taken off-line to accomplish the necessary diagnostic services. This creates a burden on operators to shut the equipment down and take it out of service and also increases equipment down time and thus costs. Therefore, a need exists for a new precise and simple process for performing diagnostic services to detect potential internal failures in electrical power equipment without shutting the equipment down or taking the equipment out of service.

SUMMARY OF THE INVENTION

The present invention is directed to an apparatus, system, and method for the performing diagnostic services on electrical power equipment, such as a power transformer, using a tap switch installed into each phase of the power transformer that allows the diagnostic service to be performed while the power transformer is operating and on-line.

The apparatus includes a mount-on type tap switch for connecting a piece of test and measurement equipment to an electrical power transformer and that allows a diagnostic service to be performed on the electrical power transformer while the transformer is operating and on-line. The tap switch includes a first switch and a second switch for selectively switching the tap switch between a non-diagnostic position wherein the tap switch connects the transformer to ground and a diagnostic position wherein the tap switch connects the transformer to the test and measurement system.

In the non-diagnostic position, the first switch is closed and the second switch is open. To switch to the diagnostic position, the second switch is closed and then the first switch is opened. To switch back to the non-diagnostic position, the first switch is closed and then the second switch is opened. Preferably, at least one of the first and second switches is closed at all times in order to prevent sparking across the bushing tap. Also, the test and measurement equipment is preferably terminated from the bushing tap by a capacitive coupling.

The tap switch is disposed between and selectively forms an electrical connection between the power transformer and the test and measurement system so that an applicable diagnostic service(s) can be performed on the live, on-line transformer.

In accordance with another embodiment of the invention, a system for performing a diagnostic service on live, in-service electrical power equipment includes an electrical power transformer, a tap switch, and a test and measurement system. The power transformer includes one or more phases and a bushing tap for each phase. A tap switch is coupled to each phase through the bushing tap. The tap switch includes a first switch and a second switch for selectively switching between ground (e.g., the non-diagnostic position) and a test and measurement position (e.g., the diagnostic position). The test and measurement system allows a test and measurement device to be connected to the transformer through the tap switch for performing a diagnostic test and/or measurement on the transformer.

Preferably, the transformer includes a large size power transformer having medium power and above. Preferably, the power transformer is a three-phase transformer.

Preferably, the tap switch is mounted on the transformer housing and includes an input lead for coupling the tap switch to the bushing tap of the transformer and an output lead for coupling the tap switch to the test and measurement system.

Preferably, the test and measurement system includes connections for allowing various test and measurement devices to be detachably coupled to the test and measurement system for the collections of data indicative of a condition of the transformer.

Exemplary diagnostic services that can be performed on the live, in-service transformer using the tap switch include one of a partial discharge and frequency response test and measurement.

In accordance with another embodiment of the invention, a method for performing on-line diagnostic services is provided using a tap switch comprising the steps of: installing a tap switch into each phase of a power transformer; connecting a test and measurement system to the tap switch; switching the tap switch from a non-diagnostic position to a diagnostic position; performing a diagnostic service on the transformer; switching the tap switch from the diagnostic position to the non-diagnostic position; wherein the transformer is live and on-line during the performance of the diagnostic service.

The method further includes providing a first switch and a second switch in the tap switch arranged in a parallel configuration, wherein the first switch is open when the second switch is closed and vice versa; connecting an input of the tap switch to a bushing tap at each phase of the power transformer; connecting an output of the tap switch to a test and measurement system used to perform the diagnostic services; selectively switching between a diagnostic position and a non- diagnostic position by closing and opening the first switch and/or the second switch of the tap switch.

In accordance with another aspect of the invention, wherein the method further includes the step of collecting data regarding a pre-breakdown condition of the power transformer using a test and measurement device connected to the test and measurement system.

In accordance with another aspect of the invention, the method further includes performing one of a partial discharge and a frequency response test.

Other features of the invention are described below.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings embodiments that are presently preferred, it being understood, however, that the invention is not limited to the specific methods and instrumentalities disclosed. In the drawings.

DETAILED DESCRIPTION OF THE PREFERRED EMBODIMENTS

Figure 1:
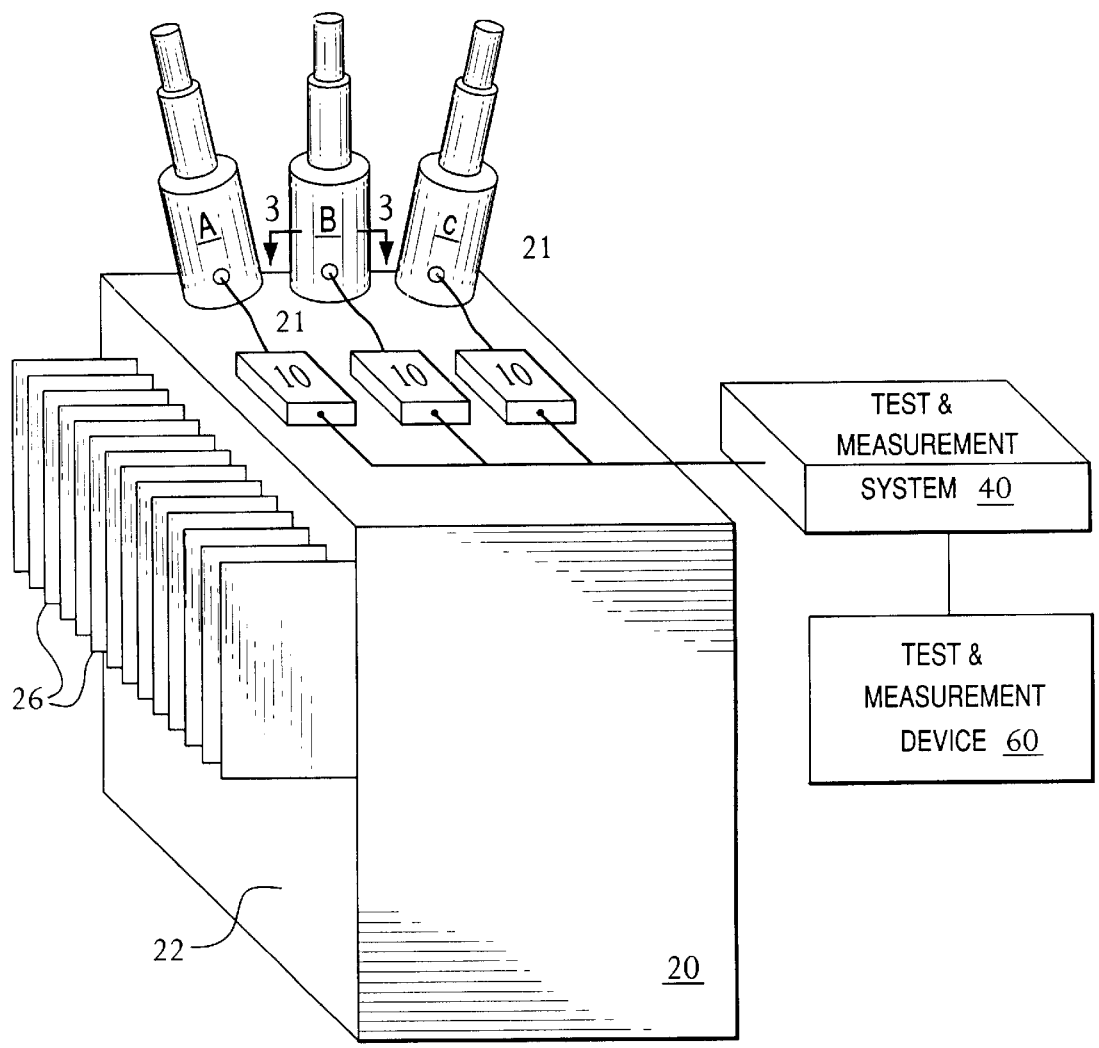
FIG. 1 shows an exemplary electrical power transformer.

The present invention relates to a tap switch 10 that is installed into each phase of an electric power transformer 20 to assist with the diagnostic servicing of electrical power transformers without shutting down the transformer or taking the transformer off-line. The tap switch 10 is used along with the appropriate diagnostic test and measurement system 40 to complete the desired diagnostic test while the transformer is live and in-service. The tap switch 10 of the present invention offers a system and method for performing a diagnostic service on a live transformer 20 in order to identify early warning signs of potential failures within the transformer 20.

A tap switch 10 is installed into each phase of a power transformer 20 to be used along with the appropriate test and measurement equipment 60 connected through the test and measurement system 40 to perform diagnostic services, including to test for and measure partial discharge and frequency response, through the bushing tap 21 of the transformer 20 when the transformer 20 is live. The tap switch 10 eliminates the hazard of disconnecting the bushing tap 21 to connect it back to the test and measurement system 40. Also, the diagnostic service(s) can be performed at the time of installation or after repairs and can be repeated periodically. If the diagnostic services indicate that the transformer 20 shows a drastic difference in its condition, it may be the time to perform further testing and/or put the transformer 20 out of service for repair.

Some advantages of using a tap switch 10 to perform diagnostic services while the electrical power equipment 20 is still live and in-service are: less manpower since the transformer does not have to be shut down, tagged-out, and taken off the grid to conduct the diagnostic service; a reduction in down time for the transformer 20; simple installation of the test and measurement equipment 60 to the test and measurement system 40; low cost involving the tap switch 10 production; and the like.

FIG. 1 shows an exemplary electrical power apparatus 20 having a tap switch 10 for performing diagnostic tests and measurements on a live piece of electrical power equipment in accordance with the present invention. As shown in FIG. 1, the electrical power apparatus 20 includes an electrical power transformer, such as a distribution or transmission transformer. Preferably, the transformer 20 includes large size power transformers having medium power and above. The transformer 20 can be any number of phases, such as, for example, a single phase or a three-phase transformer. As shown in FIG. 1, the transformer 20 includes a housing or enclosure 22 and a tap switch 10 mounted to the housing 22. The tap switch 10 can be mounted to the housing 22 of the transformer 20 using conventional techniques. As shown in FIG. 1, the test and measurement system 40 and the test and measurement device 60 are two separate units, however, it is contemplated that they could be integrated into a single unit (not shown).

Figure 2:
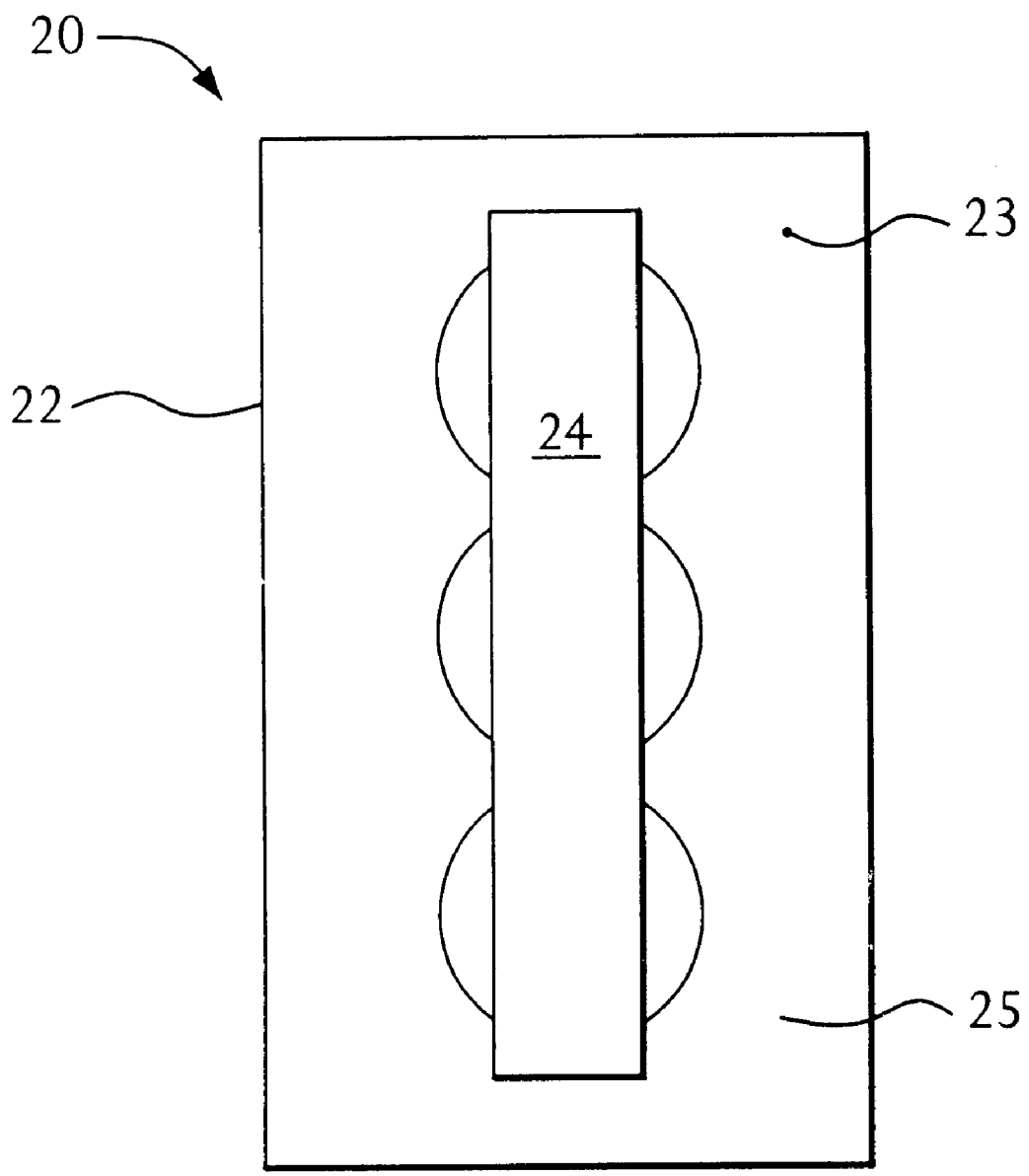
FIG. 2 is a cross-sectional view of the electrical power transformer of FIG. 1.

FIG. 2 shows a cross sectional view of the electrical power transformer 20 of FIG. 1. As shown in FIG. 2, the housing 22 defines a cavity 23 for receiving internal electrical components 24, such as a core and coil, etc. Preferably the housing 22 is a sealed housing. The cavity 23 is typically filled with a medium 25, such as a solid, fluid, or gas medium including, for example, oil, air, compressed air, a vacuum, solid insulation, rubber, plastic, paper, polyurethane, and the like. The medium 25 is preferably circulated through the coils to transfer heat generated by the transformer 20 to external radiator-like surfaces 26, where the heat can be discharged to the surrounding atmosphere.

Figure 3:
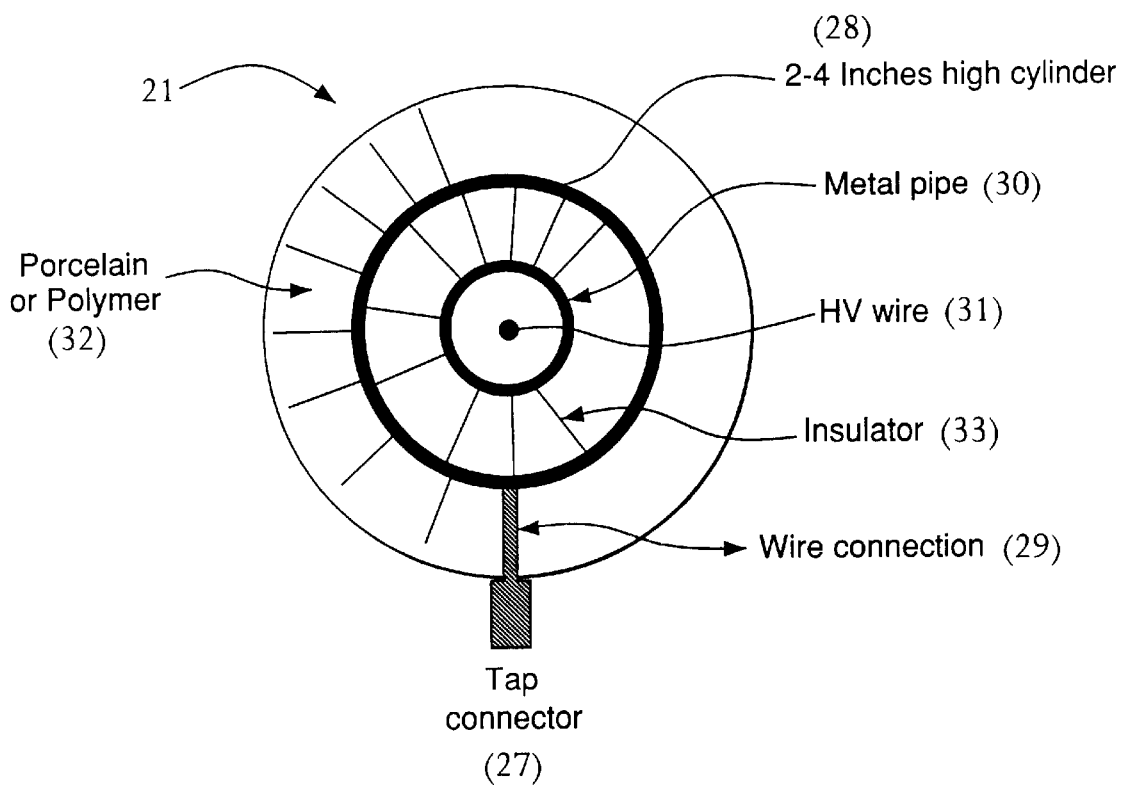
FIG. 3 is a cross-sectional view of one phase of the electrical power transformer of FIG. 1 taken along sectional line 3—3.

FIG. 3 shows a cross-sectional view of one exemplary phase of the transformer 20 of FIG. 1. As shown in FIG. 3, the bushing tap 21 includes a tap connector 27 that is connected to cylinder 28 via a wire connector 29. Cylinder 28 surrounds a metal pipe 30, which is disposed about a high voltage wire 31. A first insulator 32, such as porcelain or a polymer, is disposed around the cylinder 28 and a second insulator 33 is disposed between the cylinder 28 and the metal pipe 30. The configuration shown in FIG. 3 is one exemplary way of implementing the present invention and other suitable configurations can be used to implement the tap switch connection to the bushing tap.

Figure 4:
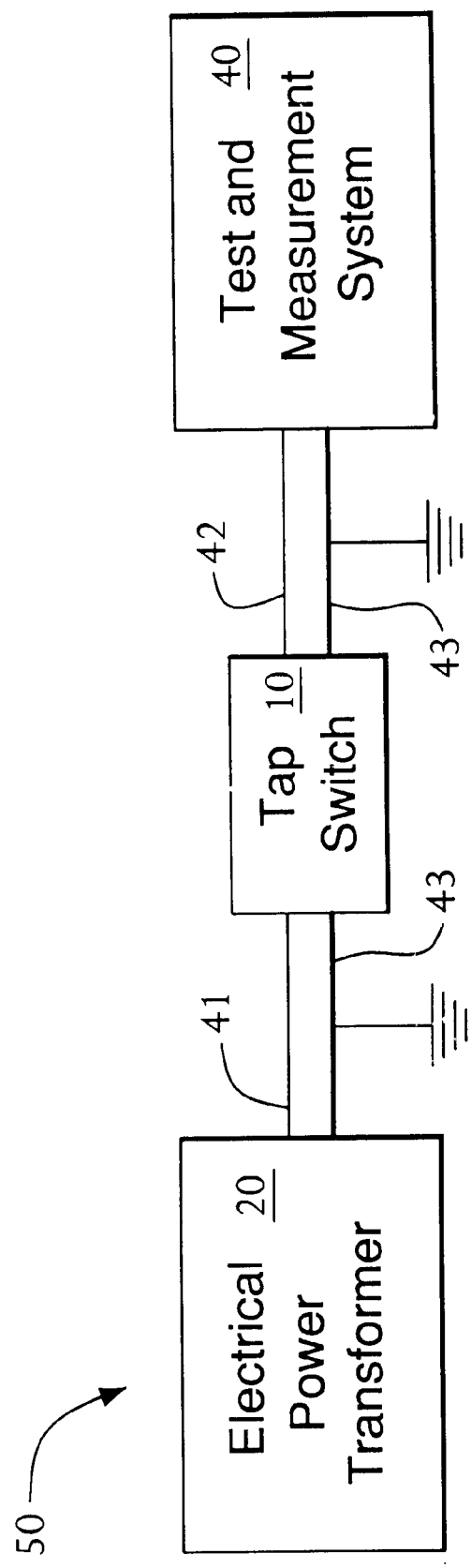
FIG. 4 shows an exemplary electrical power system including an electrical power transformer, a tap switch, and a test and measurement system for performing on-line diagnostic services in accordance with the present invention.

FIG. 4 shows an exemplary electrical power system 50 including an electrical power transformer 20, a tap switch 10, and a test and measurement system 40 for performing a diagnostic service. The tap switch 10 is electrically coupled between the electrical power transformer 20 and the test and measurement system 40. An input lead 41 connects the tap switch 10 to the electrical power transformer 20 and an output lead 42 connects the tap switch 10 to the test and measurement system 40. The transformer 20, tap switch 10, and test and measurement system 40 are each grounded. Preferably, a common ground 43 connects and grounds the transformer 20, tap switch 10, and test and measurement system 40.

When the tap switch 10 is switched to the diagnostic services position, the test and measurement system 40 is capable of performing the applicable diagnostic service while the electrical power transformer 20 is operating and on-line. Preferably, the test and measurement system 40 is detachably coupled to the tap switch 10 to allow interchangeability of the test and measurement system 40 to accommodate different diagnostic services that may be performed on the electrical power transformer. Exemplary tests and measurements include PD and frequency response.

Figure 5:
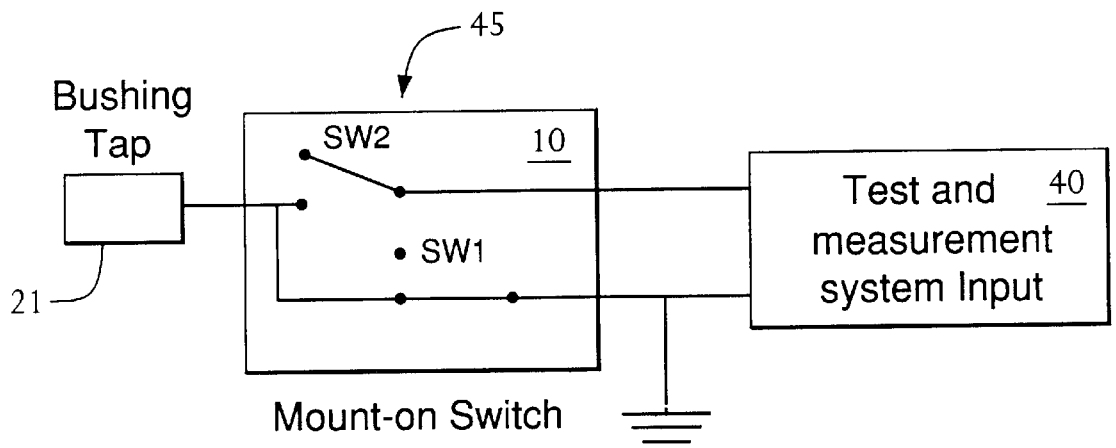
FIG. 5 is a schematic diagram of an exemplary tap switch for switching the grounded bushing tap into impedance when the transformer is energized showing SW1 closed and SW2 open.
Figure 6:
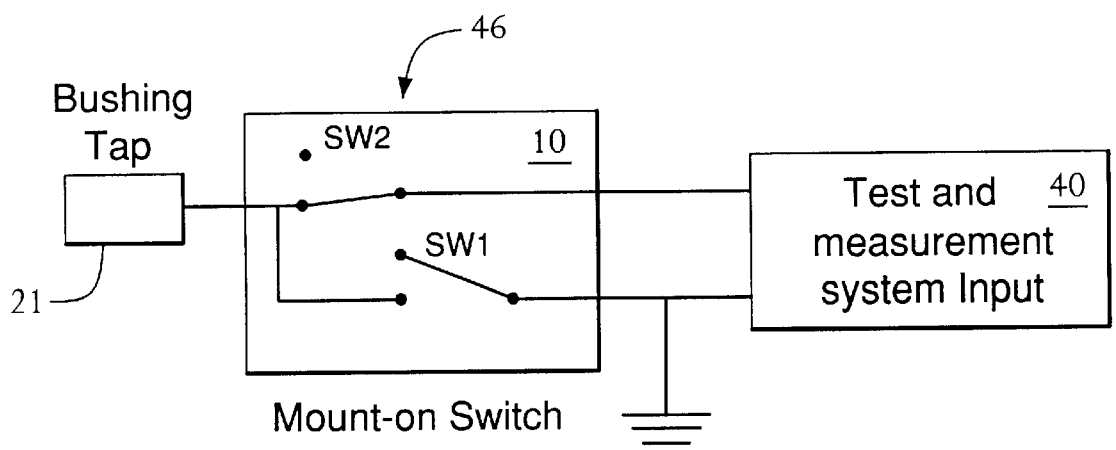
FIG. 6 is a schematic diagram of an exemplary tap switch for switching the grounded bushing tap into impedance when the transformer is energized showing SW2 closed and SW1 open.

FIGS. 5 and 6 show an exemplary tap switch 10 connected between the bushing tap 21 of the electrical power transformer 20 and the test and measurement system 40. A tap switch 10 is installed into each phase of the transformer 20. As shown in FIGS. 5 and 6, each tap switch 10 includes a first switch SW1 and a second switch SW2.

FIG. 5 shows the tap switch 10 in a non-diagnostic position 45. As shown in FIG. 5, when the tap switch 10 is in the non-diagnostic position 45, the first switch SW1 is closed and the second switch SW2 is open. Accordingly, the test and measurement system 40 is disconnected from the electrical power transformer 20 and the bushing tap is connected to ground through the first switch SW1.

FIG. 6 shows the tap switch 10 in a diagnostic position 46. As shown in FIG. 6, when the tap switch 10 is in the diagnostic position 46, the first switch SW1 is open and the second switch SW2 is closed. Accordingly, the test and measurement system 40 is connected to the electrical power transformer 20.

When switching between the non-diagnostic position 45 and the diagnostic position 46, the tap switch 10 is operated such that at least one switch is closed at all times so as to prevent sparking. So, when switching from the non-diagnostic position 45 to the diagnostic position 46, SW2 is closed first and then SW1 is opened. Likewise, when switching from the diagnostic position 46 to the non-diagnostic position 45, SW1 is closed first and then SW2 is opened.

Power transformers 20 require periodic testing to ensure their insulation is in good working condition. Partial discharge (PD) and frequency response tests are well known methods for transformer testing. Typically, these diagnostic services require connecting the bushing tap 21 to a test and measurement system 40 (e.g., an impedance box), which has several functions, including:

1. Providing a capacitive loading for the bushing tap.
2. Providing signal separation for high frequency PD and 50/60 HzAC.
3. Providing signal conditioning for a clean and coherent signal.

Typically, the output signal from the test and measurement system 40 is fed to an Analog to Digital Converter (ADC) and a computer (not shown) for storage and/or analysis.

When the transformer 20 is in operation, the bushing tap 21 is either grounded or terminated by a capacitive load, otherwise it may create a dangerous ark, which is undesirable. As shown in FIG. 4, a common ground 43 is preferably provided to ground the electrical power transformer 20, the tap switch 10, and the test and measurement system 40.

The tap switch 10 of FIGS. 5 and 6 is preferably capable of switching the grounded bushing tap of the non-diagnostic position 45 (shown in FIG. 5) into the test and measurement system 40 of the diagnostic position 46 (shown in FIG. 6) when the transformer 20 is energized. Preferably, the tap switch 10 is placed permanently into the bushing tap to avoid having to mount more expensive test and measurement systems 40 on a more permanent basis.

One exemplary diagnostic test that can be performed using the tap switch 10 of the present invention includes partial discharge (PD) which can be measured through the bushing tap when the transformer is live. PD measurements can be used to identify electrical pre-breakdown development in the vicinity of PD. PD is an initial part of electrical breakdown in electrical power equipment and is usually accompanied by acoustic events. This phenomenon serves as a basis for acoustical techniques of detecting and locating electrical discharges, such as PD. Thus, by using the tap switch and method of the present invention, diagnostic tests can be performed while the transformer is operating and without taking the electrical power equipment off-line. This provides a number of advantages, including the fact that the equipment does not have to be shut down and taken off-line which save manpower and costs.

A partial discharge test can be performed by connecting a test and measurement system 40, such as an impedance box, to the tap switch 10. When the tap switch 10 is flipped from the non-diagnostic position 45 of FIG. 5 to the diagnostic position 46 of FIG. 6, the test and measurement system 40 will be connected to the bushing tap through the tap switch 10. The test and measurement system 40 has to be grounded properly and after the tap switch 10 is flipped the test and measurement system 40 can be connected to the applicable test and/or measurement device 60 (see FIG. 1), such as a PD test meter.

The PD calibration is typically done after electric shut down of the transformer 20. However, using the tap switch 10 of the present invention to perform on-line PD tests and measurements, the calibration can be achieved when the system is live. This can be achieved by using, for example, a high voltage calibration coupler or a CT mounted on the high voltage line. Alternatively, the measurement can be calibrated at the installation of the transformer and calibration parameters can be stored to be used during measurement. The objective is to perform the PD test after the transformer is mounted and all connections are installed and using the grid voltage.

The test and measurement data can be stored in, for example, the form of Pico Coulombs and PD maps, which map the location of discharges relative to the phase angle. When periodic tests are performed later, a comparison can be made and the tester will be able to determine any difference in measurement results between subsequent measurements.

Another exemplary diagnostic test that can be performed using the tap switch 10 of the present invention includes frequency response, which again can be measured through the bushing tap 21 when the transformer 20 is live. This test can be performed through the bushing tap 21 since it has a capacitive coupling with the high voltage line. The bushing tap 21 should be terminated by a capacitor (not shown) to ensure that no sparking will occur across the input of the test and measurement system 40. The input can be connected to either phase and the read-back can be connected to either of other phases. As is the case for partial discharge measurement, a test for frequency response can be done at the time of installation and compared with later tests. The test results can be in the form of, for example, A-B, A-C, B-A, B-C, C-A, and C-B in which the first letter stands for the phase where the input signal is connected and the second letter stands for the phase where the output or read-back signal is connected. Also, this process can be automated to speed up the test and to reduce human error.

The apparatus, system, and method for performing live, on-line diagnostic services is an improvement over conventional systems that typically require that the electrical power equipment be shutdown and taken off-line in order to perform the required diagnostic test and/or measurement. The tap switch 10 provides for live diagnostic services of on-line electrical equipment 20 that provides cost savings to electrical power companies. This leads to sufficient labor and cost savings due to the fact that the electrical power equipment 20 is still operating and in-service resulting in less down time for utilities and less testing time due to the elimination of transformer disconnection from the power grid (not shown).

Figure 7:
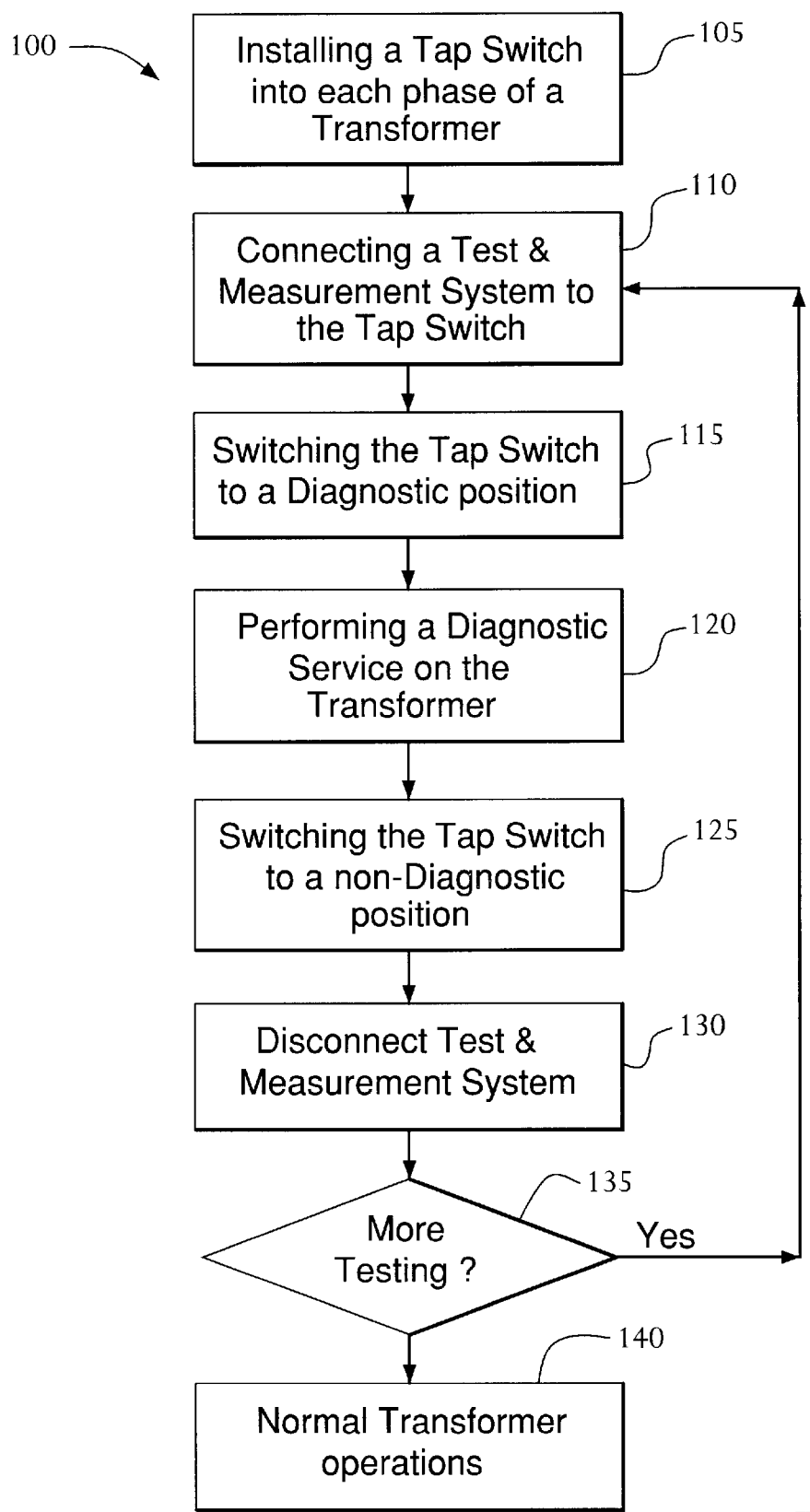
FIG. 7 is a flowchart showing an exemplary method for performing on-line diagnostic services using a tap switch installed into each phase of an electrical power transformer in accordance with the present invention.

FIG. 7 shows a flowchart of an exemplary method of performing a diagnostic service on an operating, in-service power transformer using a tap switch. As shown in FIG. 7, the exemplary method 100 includes: installing a tap switch into each phase of a power transformer, at step 105; connecting a test and measurement system to the tap switch, at step 110; switching the tap switch from a non-diagnostic position to a diagnostic position, at step 115; performing a diagnostic service on the transformer, at step 120; and switching the tap switch from the diagnostic position to the non-diagnostic position, at step 125.

At step 130 the test and measurement system is disconnected. A determination can be made at step 135 as to whether additional testing is desired/required. If yes, then the process continues back at step 110. If no, then the process ends and normal operations of the transformer can be resumed at step 140.

The method further includes providing a first switch and a second switch in the tap switch arranged in a parallel configuration, wherein the first switch is open when the second switch is closed and vice versa. An input of the tap switch is connected to a bushing tap at each phase of the power transformer and an output of the tap switch is connected to the test and measurement system used to perform the diagnostic services. The tap switch is selectively switched between a diagnostic position and a non-diagnostic position by closing and opening the first switch and/or the second switch of the tap switch.

The method further includes the step of collecting data indicative of a pre-breakdown condition of the power transformer using a test and measurement device connected to the test and measurement system. The method further includes performing one of a partial discharge and a frequency response test.

The tap switch of the present invention can be placed on new manufactured transformers, as well as, being placed on existing transformers already in-service.

It is to be understood, however, that even in numerous characteristics and advantages of the present invention have been set forth in the foregoing description, together with details of the structure and function of the invention, the disclosure is illustrative only, and changes may be made to detail, especially in matters of shape, size and arrangement of parts within the principles of the invention to the full extent indicated by the broad general meaning of the terms in which the appended claims are expressed.

What is claimed is:

1. A tap switch for allowing live diagnostic services to be performed on an in-service electrical power transformer comprising:
 a tap switch permanently disposed as part of said electrical power transformer between each phase of said electrical power transformer and a test and measurement system, wherein said tap switch comprises:
  a first switch selectively connected to ground in a closed position; and
  a second switch selectively connected to said test and measurement system in a closed position;
  wherein,
   said first switch is open when said second switch is closed, and
   said first switch is closed when said second switch is open.

2. The tap switch of claim 1, wherein said tap switch is selectively switchable between:
 a non-diagnostic position wherein said first switch is closed and said second switch is open; and
 a diagnostic position wherein said first switch is open and said second switch is closed.

3. The tap switch of claim 1, wherein each of said tap switches further comprises an input lead connected to said electrical power transformer and an output lead connected to said test and measurement system.

4. The tap switch of claim 3, wherein each of said input leads is connected to a bushing tap of one phase of said electrical power transformer.

5. The tap switch of claim 1, wherein said tap switch is mounted to said electrical power transformer.

6. A method for performing a live diagnostic service on an in-service electrical power transformer using a tap switch comprising the steps of:
 permanently installing a tap switch into each phase of a power transformer;
 connecting a test and measurement system to said tap switch;
 switching said tap switch from a non-diagnostic position wherein said transformer is connected to ground through said tap switch to a diagnostic position wherein said transformer is connected to said test and measurement system through said tap switch;
 performing a diagnostic service on said live, in-service electrical power transformer; and
 switching said tap switch from said diagnostic position to said non-diagnostic position.

7. The method of claim 6, further comprising the steps of:
 providing a first switch and a second switch arranged in a parallel configuration in each tap switch;
 connecting an input of each tap switch to a bushing tap at each phase of said power transformer;
 connecting an output of said tap switch to said test and measurement system used to perform said diagnostic service; and
 selectively switching between said diagnostic position and said non-diagnostic position by opening and closing said first switch and said second switch, respectively, of said tap switch.

8. The method of claim 7, further comprising the steps of closing said second switch and opening said first switch to place said tap switch in said diagnostic position; and closing said first switch and opening said second switch to place said tap switch in said non-diagnostic position.

9. The method of claim 6, further comprising the step of performing one of a partial discharge and a frequency response test as said diagnostic service.

10. The method of claim 6, further comprising the step of collecting data indicative of a pre-breakdown condition of said power transformer using said test and measurement system connected to said power transformer through said tap switch.

11. The method of claim 6, further comprising the step of grounding or terminating by a capacitive load said tap switch so as to prevent sparking.

* * * * *